United States Patent
Ro et al.

(10) Patent No.: US 6,242,326 B1
(45) Date of Patent: Jun. 5, 2001

(54) METHOD FOR FABRICATING COMPOUND SEMICONDUCTOR SUBSTRATE HAVING QUANTUM DOT ARRAY STRUCTURE

(75) Inventors: Jung-Rae Ro; Sung-Bock Kim; Kyoung-Wan Park, all of Taejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 09/452,853

(22) Filed: Dec. 2, 1999

(30) Foreign Application Priority Data

Dec. 2, 1998 (KR) .................................... 98-52529

(51) Int. Cl.[7] .................................. H01L 21/203
(52) U.S. Cl. ......................... 438/493; 438/47; 438/962
(58) Field of Search ...................... 438/39, 47, 493, 438/495, 962, FOR 249, FOR 289, FOR 293; 117/87

(56) References Cited

U.S. PATENT DOCUMENTS

| | | |
|---|---|---|
| 5,258,326 | * 11/1993 | Morishima et al. . |
| 5,313,484 | * 5/1994 | Arimoto . |
| 5,482,890 | 1/1996 | Liu et al. . |
| 5,518,955 | * 5/1996 | Goto et al. . |
| 5,543,354 | 8/1996 | Richard et al. . |
| 5,614,435 | 3/1997 | Petroff et al. . |
| 5,831,294 | * 11/1998 | Ugajin . |

FOREIGN PATENT DOCUMENTS 8-181301 * 7/1996 (JP) .
10-289996 * 10/1998 (JP) .

OTHER PUBLICATIONS

American Institute of Physics, Semiconductors 30 (2), Feb. 1996, pp. 194–196.
American Institute of Physics, Appl. Phys. Lett. 66, (26), Jun. 26, 1995, 6 pages.
American Institute of Physics, Appl. Phys. Lett. 66, (13), Mar. 27, 1995, 6 pages.

* cited by examiner

Primary Examiner—George Fourson
Assistant Examiner—Michelle Estrada
(74) Attorney, Agent, or Firm—Blakely Sokoloff Taylor & Zafman

(57) ABSTRACT

A method for fabricating a compound semiconductor substrate having a quantum dot array structure includes the steps of forming a plurality of dielectric thin layer patterns on a substrate, thereby forming an exposed area of the substrate, sequentially forming buffer layers and barrier layers in a pyramid shape on the exposed area of the substrate, forming Ga droplets on the barrier layers, transforming the Ga droplets into GaAs quantum dots, performing a thermal process to the substrate, and growing the buffer layers and the barrier layers to thereby form a passivation layer capping the GaAs quantum dots.

8 Claims, 7 Drawing Sheets

METHOD FOR FABRICATING COMPOUND SEMICONDUCTOR SUBSTRATE HAVING QUANTUM DOT ARRAY STRUCTURE

FIELD OF THE INVENTION

The present invention relates to a method for fabricating a compound semiconductor substrate having an ultra-fine structure; and, more particularly, to a method for fabricating a compound semiconductor substrate having a quantum dot array structure for use in semiconductor devices such as a semiconductor laser, an optical device, a transistor and a memory device.

DESCRIPTION OF THE PRIOR ART

In a technique for fabricating a semiconductor substrate having a quantum dot array structure, a Stranski-Krastanow growth method has been recently researched and developed which uses a strain-relaxation process of a lattice mismatched materials. However, irregular-sized quantum dots are irregularly arranged on the substrate surface, so that there has been a problem in a device fabrication, particularly in a semiconductor device fabrication. Additionally, since the Stranski-Krastanow growth method can be only applied to the lattice mismatched materials, it has a limit on available materials in a device fabrication.

SUMMARY OF THE INVENTION

It is, therefore, an object of the present invention to provide a method for fabricating a compound semiconductor substrate having a quantum dot array structure for use in semiconductor devices such as a semiconductor laser, an optical device, a transistor and a memory device.

In accordance with an aspect of the present invention, there is provided a method for fabricating a compound semiconductor substrate having a quantum dot array structure, comprising the steps of: a) forming a plurality of dielectric thin layer patterns on a substrate, thereby forming an exposed area on the substrate; b) sequentially forming buffer layers and barrier layers in a pyramid shape on the exposed area of the substrate in this order; c) forming Ga droplets on the barrier layers; d) transforming the Ga droplets into GaAs quantum dots; e) performing a thermal process to the substrate; and f) growing the buffer layers and the barrier layers to form a passivation layer capping the GaAs quantum dots.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

The present invention provides a method for fabricating a compound semiconductor substrate having a quantum dot array structure such as GaAs, InGas and Ins arranged at a predetermined position by using a metalorganic chemical vapor deposition (MOCVD), a molecular beam epitaxy (MBE), a chemical beam epitaxy (CBE) and so on. For convenience's sake, a CBE method which uses triethylgallium (TEGa) and arsine ($AsH_3$) as groups III and V, respectively, are used for a fabrication of Gas quantum dots. At this time, AlGaAs is used for barriers and a trimethylaluminum (TMAl) is used as a source of aluminum (Al).

The present invention will be described with reference to the accompanying drawings.

Figure 1A:
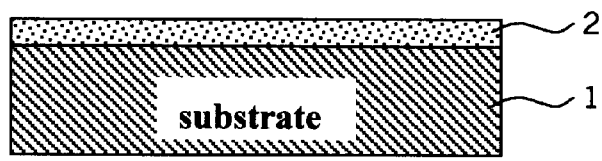
FIGS. 1A to 1F are cross-sectional views illustrating the steps of a method for forming a compound semiconductor substrate with a quantum dot array structure according to the present invention.
Figure 1B:
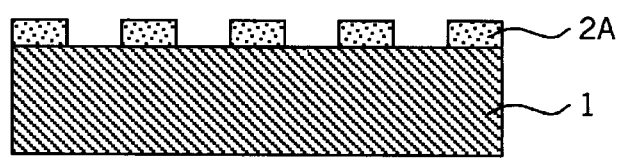

As shown in FIGS. 1A and 1B, a dielectric thin film 2 such as a silicon oxide and a silicon nitride is deposited on a GaAs substrate 1 to a thickness of about 150 nm. Next, a photolithography process and a wet etching process are performed to form dielectric thin film patterns 2A in a square form of 1 $\mu$m×1 $\mu$m at predetermined positions where to form quantum dots at following processes.

Figure 1C:
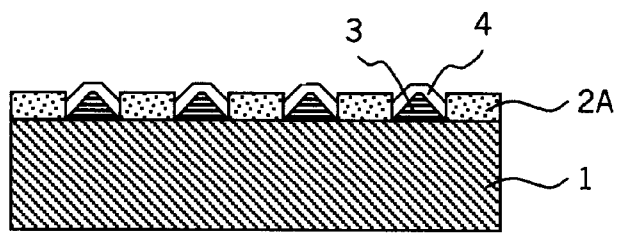

As shown in FIG. 1C, after performing a thermal process, GaAs buffer layers 3 and AlGaAs barrier layers 4 are sequentially grown by a method such as an MOCVD, an MBE or a CBE. At this time, the GaAs buffer layers 3 and the AlGaAs barrier layers 4 have sidewalls with the (111) plane in a pyramid shape, wherein an upper portion of the pyramid is grown to a structure having a (100) plane exposed to several decade nm in size by controlling a growth time.

Figure 1D:
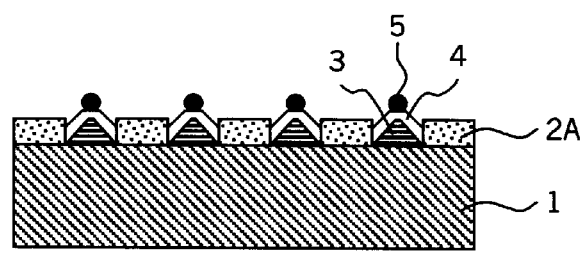
Figure 2:
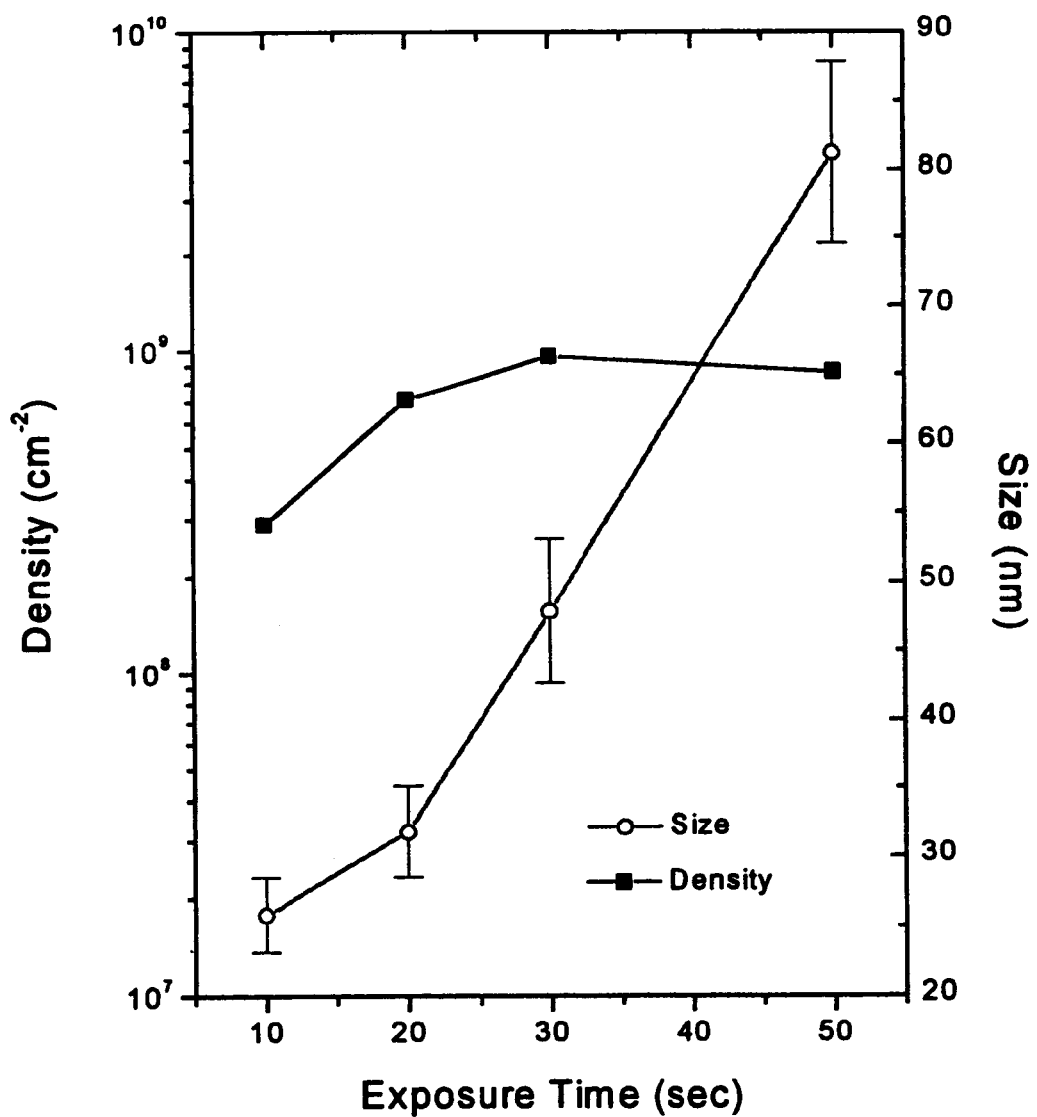
FIG. 2 is a graph showing a size and a density of Ga droplet with respect to a TEGa supply time at a substrate temperature of 475° C.
Figure 3:
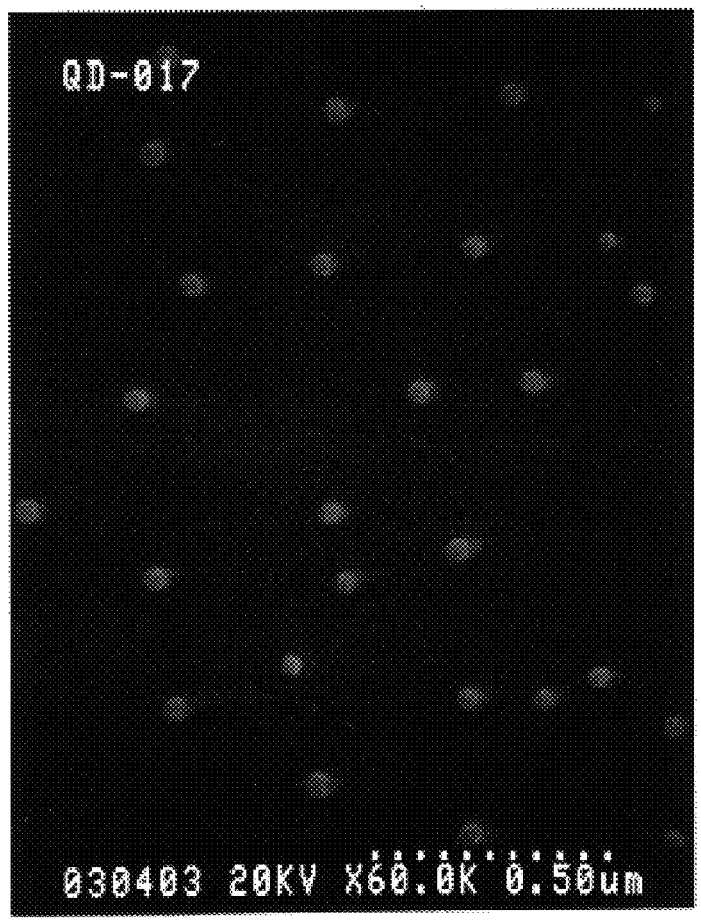
FIG. 3 is a SEM microphotograph of a surface of Ga droplet.

As shown in FIG. 1D, by supplying TEGa, Ga droplets 5 are formed on each pyramid-shaped barrier layer 4. At this time, instead of supplying arsine ($AsH_3$), TEGa alone is supplied to form Ga droplets on the upper portion of the exposed barrier layer 4. Since a mobility of the Ga adspecies (adsorbed species) is higher on the (111) plane, i.e., on sidewalls of the exposed pyramid-shaped barrier layers 4 rather than on the (100) surface of the upper portion, the Ga droplets are formed only on the upper portion, not on the sidewalls. Additionally, the upper portion is formed to several decade nm in size, the surface mobility of the Ga adspecies is lowered. Therefore, one Ga droplet is formed on each pyramid-shaped barrier layer 5. The size of the Ga droplets can be controlled according to the TEGa supply time. FIG. 2 shows an experimental result on the size and density of the Ga droplet according to the TEGa supply time. Furthermore, FIG. 3 shows a SEM microphotograph of the Ga droplets formed on the surface of the GaAs substrate.

Figure 1E:
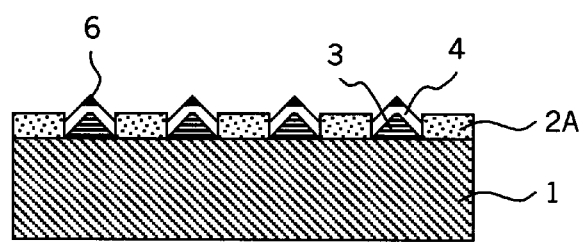
Figure 4:
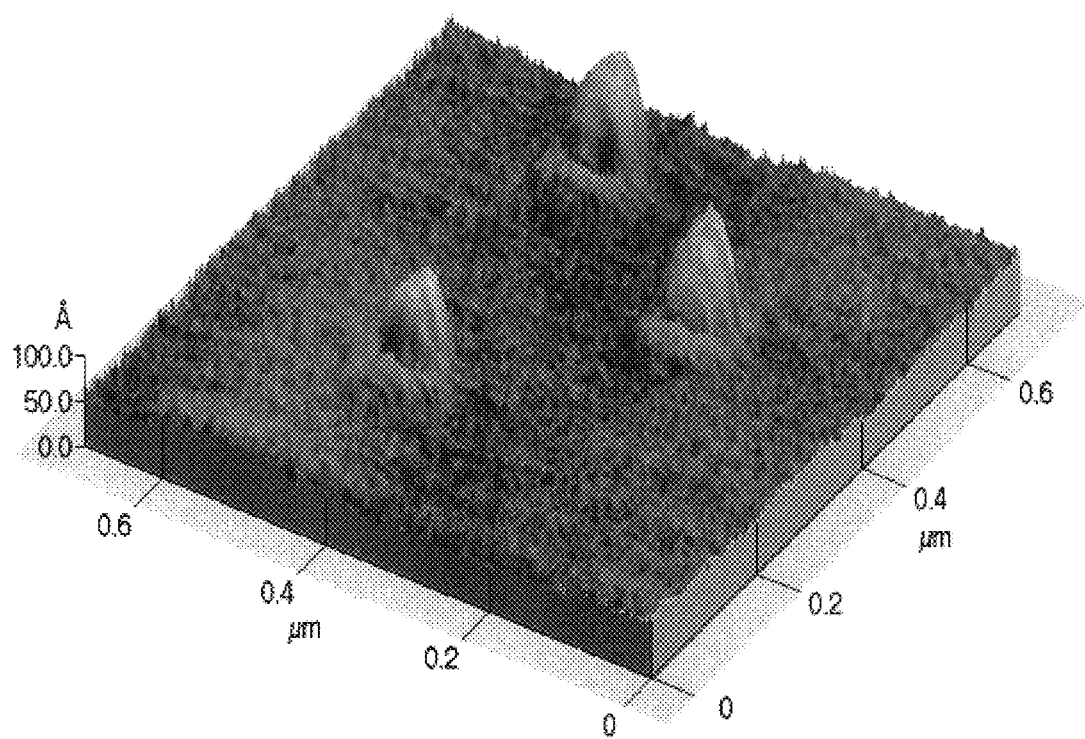
FIG. 4 is an AFM microphotograph of a shape of GaAs quantum dots.
Figure 5:
FIG. 5 is a TEM microphotograph of a crystalline of GaAs quantum dots; aid

As shown in FIG. 1E, after lowering a partial pressure of the TEGa through an appropriate control of an evacuation period of the TEGa, arsenic ($AsH_3$) which previously dissociated at a temperature of about 1000° C. is supplied to transform the Ga droplets into GaAs quantum dots 6. FIG. 4 shows an atomic force microscopy (AFM) microphotograph of the GaAs quantum dots 6 grown on the surface of the GaAs substrate. FIG. 5 shows a transmission electron microscopy (TEM) microphotograph of the GaAs quantum dots 6. It can be seen from FIGS. 4 and 5 that the GaAs quantum dots 6 have an excellent crystalline characteristic and there are not structural defects therein.

Figure 1F:
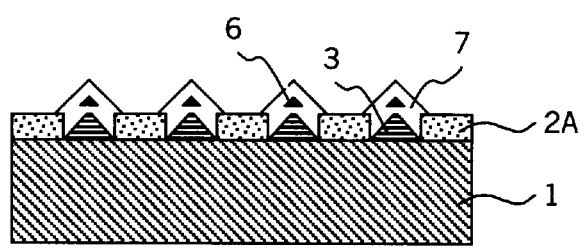

As shown in FIG. 1F, for obtaining a quantum effect, AlGaAs barrier layers 4 and the GaAs layers 3 are grown to form a passivation layer 7 thereon.

FIGS. 6A to 6D show reaction mechanisms for the growth of the GaAs quantum dots.

Figure 6A:
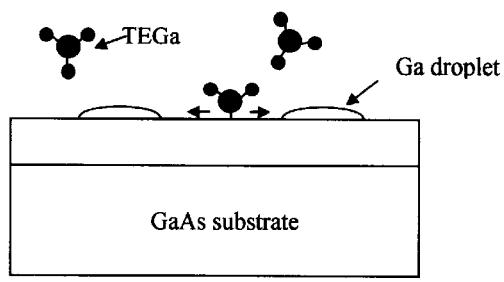
FIGS. 6A to 6D are views of reaction mechanisms illustrating a formation of GaAs quantum dots.
Figure 6B:
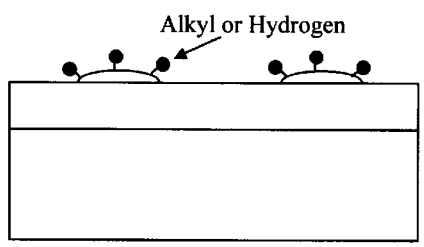
Figure 6C:
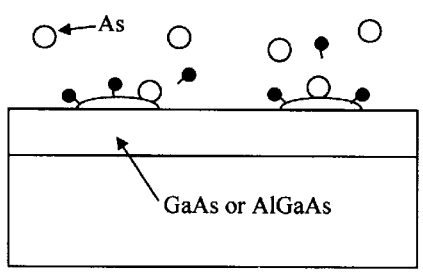
Figure 6D:
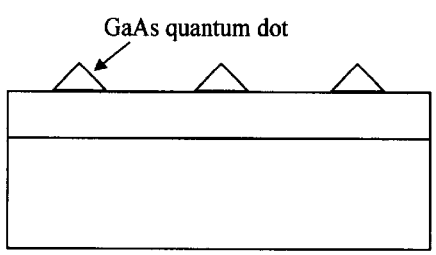

FIG. 6A shows the Ga droplets formed on the GaAs substrate by supplying the TEGa. FIG. 6B is a diagram after cutting off the TEGa supply due to an evacuation of alkyl or hydrogen. FIG. 6C shows a transformation of the Ga droplets into the GaAs by supplying arsine ($AsH_3$). FIG. 6D shows a formation of the GaAs quantum dots by the evacuation of arsine ($AsH_3$)

The quantum dot array structure according to the present invention can preferably be formed on arbitrary positions. In addition to the GaAs quantum dots, the present invention can be applied to compound semiconductor substrates having quantum dot structure such as InAs, GaSb, InP, GaP and so on. Furthermore, the TEGa and the $AsH_3$ can be substituted by typical materials of groups III and V, respectively.

As mentioned above, without using a high-resolution lithography, the aligned quantum dot array structure can be formed by the simple photolithography and growth process. The present invention can also be applied to a formation of a nanometer-scaled device with a high density, e.g., a quantum dot cellular automate and a quantum dot transistor.

What is claimed is:

1. A method for fabricating a compound semiconductor substrate having a quantum dot array structure, comprising the steps of:

a) forming a plurality of dielectric thin film patterns on a substrate, thereby forming an exposed area on the substrate;

b) sequentially forming buffer layers and barrier layers in a pyramid shape on the exposed area of the substrate in this order;

c) forming Ga droplets on the barrier layers;

d) transforming the Ga droplets into GaAs quantum dots;

e) performing a thermal process to the substrate; and f) growing the buffer layers and the barrier layers to thereby form a passivation layer capping the GaAs quantum dots.

2. The method as recited in claim 1, wherein the substrate is formed with one selected from the group consisting of GaAs, InAs, GaSb, InP and GaP.

3. The method as recited in claim 1, wherein the dielectric thin film patterns are formed with one selected from the group consisting of a silicon oxide and a silicon nitride.

4. The method as recited in claim 1, wherein the buffer layer is a GaAs and the barrier layer is an AlGaAs.

5. The method as recited in claim 3, wherein the buffer layers and the barrier layers are grown by using one method of MOCVD, MBE or CBE.

6. The method as recited in claim 1, wherein the Ga droplets are formed by supplying TEGa.

7. The method as recited in claim 6, wherein after lowering a partial pressure of the TEGa through a control of an evacuation period of the TEGa, the Ga droplets are transformed into the GaAs quantum dots by supplying arsine ($AsH_3$) dissociated at a temperature of about 1000° C.

8. The method as recited in claim 7, wherein the TEGa and the arsine ($AsH_3$) are substituted by materials of groups III and V, respectively.

* * * * *